US012690242B2

(12) United States Patent
Huang et al.

(10) Patent No.: US 12,690,242 B2
(45) Date of Patent: Jul. 21, 2026

(54) VOLTAGE-SUSTAINING LAYER FOR SEMICONDUCTORS

(71) Applicant: University of Electronic Science and Technology of China, Chengdu (CN)

(72) Inventors: Haimeng Huang, Chengdu (CN); Xinghao Tong, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 477 days.

(21) Appl. No.: 18/063,572

(22) Filed: Dec. 8, 2022

(65) Prior Publication Data

US 2023/0108349 A1 Apr. 6, 2023

(30) Foreign Application Priority Data

Mar. 2, 2022 (CN) .......................... 202210197937.7

(51) Int. Cl.
*H10D 62/10* (2025.01)

(52) U.S. Cl.
CPC ......... *H10D 62/111* (2025.01); *H10D 62/115* (2025.01)

(58) Field of Classification Search
CPC .. H10D 62/111; H10D 62/115; H10D 62/116; H10D 62/124
USPC ....................................................... 257/493
See application file for complete search history.

(56) References Cited

U.S. PATENT DOCUMENTS

| | | | | |
|---|---|---|---|---|
| 5,216,275 A | 6/1993 | Chen | | |
| 6,943,410 B2 * | 9/2005 | Fujihira | ................. | H10D 30/66 |
| | | | | 257/490 |
| 2006/0219997 A1 * | 10/2006 | Kawasaki | .............. | H10D 62/82 |
| | | | | 257/E29.05 |
| 2007/0120187 A1 * | 5/2007 | Udrea | .................. | H10D 62/116 |
| | | | | 257/347 |
| 2007/0200183 A1 * | 8/2007 | Rueb | .................. | H10D 30/0295 |
| | | | | 257/E29.313 |
| 2011/0084333 A1 * | 4/2011 | Disney | ................... | H10D 30/66 |
| | | | | 438/270 |
| 2021/0242340 A1 * | 8/2021 | Siemieniec | ........ | H10D 30/0297 |

OTHER PUBLICATIONS

Wataru Saito. Comparison of Theoretical Limits between Superjunction and Field Plate Structures, Proceedings of The 25th International Symposium on Power Semiconductor Devices & ICs, Kanazawa, pp. 241-244.

* cited by examiner

*Primary Examiner* — Mohammad M Hoque

(57) ABSTRACT conductivity type, a first region doped with the first conductivity type, a second region doped with the second conductivity type, N first oxide layers and K second oxide layers. The second region is located above the second drain region. The first region is located above the drain region and at a side of the second region. The source region is located above the first region and the second region. The first oxide layers are located at a side in the second region close to the source region. The second oxide layers are located at a side in the first region close to the drain region.

15 Claims, 18 Drawing Sheets

--Prior Art--

Fig. 1

VOLTAGE-SUSTAINING LAYER FOR SEMICONDUCTORS

CROSS-REFERENCE TO RELATED APPLICATIONS

This application claims the benefit of priority from Chinese Patent Application No. 202210197937.7, filed on Mar. 2, 2022. The content of the aforementioned application, including any intervening amendments thereto, is incorporated herein by reference in its entirety.

TECHNICAL FIELD

This application relates to semiconductor devices, and more particularly to a voltage-sustaining layer for semiconductors.

BACKGROUND

With respect to semiconductor power devices, especially high-voltage power devices, it is necessary to optimize the structure to reduce the internal electric field, so as to enhance the surface breakdown voltage and reduce the specific on-resistance, thereby reducing the ionization integral of the electronic devices.

U.S. Patent Publication No. 5216275A, titled "Semiconductor power devices with alternating conductivity type high-voltage breakdown regions", proposed a conventional super-junction structure (C-SJ structure) (shown in FIG. 1). In the superjunction structure, through the lateral charge compensation of alternating n-columns and p-columns, the distribution of the internal electric field becomes more uniform, and the electronic devices have a higher doping concentration in the drift region, reducing the specific on-resistance while maintaining the breakdown voltage. Moreover, an insulator superjunction structure (I-SJ structure) can be fabricated by inserting an insulator between the n-column and the adjacent p-column (as shown in FIG. 2) (W. Saito. Comparison of Theoretical Limits between Superjunction and Field Plate Structures Proc. Int. Symp. Power Semicond. Devices ICs, pp. 241-244.). The I-SJ structure not only reduces the electric field strength in the n-column conducting region, but also blocks the path of ionization integral passing through the boundary between the p-column and the n-column, thereby reducing the corresponding ionization integral and increasing the breakdown voltage of the electronic device. However, the insulator can only greatly reduce the ionization integral across the boundary between the p-column and n-column, and has less effect on the ionization integral along the electric field line (EFL) path of AA' shown in FIG. 2. Considering that the maximum ionization integral is generally reached at the AA' path, the effect of the insulator on the breakdown voltage is actually limited. In order to reduce the ionization integral of the AA' path more effectively and significantly increase the breakdown voltage of the electronic device, it is possible to change the doping concentration of the n-column and p-column, thereby reducing the electric field at point A through the charge imbalance compensation. In this case, the electric field intensity at point B' is increased, such that the breakdown point of the device is shifted from point A to point B'. In the case of charge balance, the difference in ionization integrals of AA' path and B'B path is relatively small since it is only caused by the difference between electrons and holes, limiting the improvement of the breakdown voltage, and even reducing the breakdown voltage in most charge imbalance cases.

SUMMARY

An objective of this application is to provide a voltage-sustaining layer for semiconductors, which can change the path of electric field lines to optimize the path of ionization integral, so as to effectively reduce the ionization integral, allowing a smaller specific on-resistance and a larger breakdown voltage.

Technical solutions of this application are described as follows.

In a first aspect, this application provides a voltage-sustaining layer for semiconductors, comprising:
  a source region heavily doped with a first conductive type;
  a drain region heavily doped with a second conductive type;
  a first region doped with the first conductive type;
  a second region doped with the second conductive type;
  N first oxide layers; and
  K second oxide layers;
  wherein the second region is located above the drain region; the first region is located above the drain region and at a side of the second region; the source region is located above the first region and the second region; the N first oxide layers are located at a side in the second region close to the source region; the K second oxide layers are located at a side in the first region close to the drain region; and N and K are independently a positive integer greater than 1.

In an embodiment, a tapered superjunction (T-SJ) with a trench angle is formed between the second region and the first region.

In an embodiment, an oxide insulator is provided between the second region and the first region.

In an embodiment, an oxide insulator with a trench angle is provided between the second region and the first region.

In an embodiment, the second region and the first region each have a vertical varying doping profile.

In an embodiment, a buffer layer is provided between the drain region and the second region and between the drain region and the first region, and the buffer layer is made of the second conductive type.

In an embodiment, a plurality of third oxide layers is provided at a first side of the buffer layer, and a plurality of fourth oxide layers are provided at a second side of the buffer layer.

In an embodiment, when a width of each of the N first oxide layers gradually increases, a width of each of the K second oxide layers gradually decreases.

In an embodiment, when a width of each of the N first oxide layers gradually decreases, a width of each of the K second oxide layers gradually increases.

In an embodiment, each of the N first oxide layers is separated from a boundary of the second region, and each of the K second oxide layers is separated from a boundary of the first region.

In an embodiment, the doping concentration of each of the source region, the drain region, the second region and the first region is adjustable according to breakdown voltage, aspect ratio, etc.; a width of the oxide insulator is adjustable according to the breakdown voltage, aspect ratio, etc.; the width and thickness of each of the first oxide layer and the second oxide layer are adjustable according to the breakdown voltage, aspect ratio, etc.

In an embodiment, the N first oxide layers and the K second oxide layers each have a thickness of 0.1~1 μm.

In a second aspect, this application provides a superjunction structure, wherein the superjunction structure is achieved by extending the voltage-sustaining layer structure mentioned above by means of interdigitated layout (as shown in FIG. 10), hexagonal layout (as shown in FIG. 11) or square layout (as shown in FIG. 12).

The working principle of the voltage-sustaining layer provided herein is illustrated as follows.

FIG. 4 schematically shows the distribution of electric field lines of the voltage-sustaining layer. The first oxide layer can effectively isolate the ionization integral of points on and near the AM line. The second oxide layer can effectively isolate the ionization integral of points on and near the B'M' line. In this case, the path of ionization integral is greatly shortened, and the maximum ionization integral of the device declines. In the case of a reduced maximum ionization integral, since the maximum ionization integral at breakdown is equal to 1, the breakdown voltage can be continuously increased under the unchanged doping concentration.

By increasing the doping concentration of the first region doped with the first conductive type and the second region doped with the second conductive type, the breakdown voltage can be lowered to the originally-required level, and the electric field in the effective ionization integral is strengthened. When the ionization integral reaches 1, the specific on-resistance of the device is greatly reduced. Under the same breakdown voltage, the voltage-sustaining layer can greatly reduce the specific on-resistance and significantly improve the performance of the device.

Compared with the prior art, this application has the following beneficial effects.

With respect to the voltage-sustaining layer provided herein, the second region doped with the second conductive type and the first region doped with the first conductive type are respectively provided with oxide layers to block the electric field lines, so as to reduce the ionization integral of the electronic device, enhancing the breakdown voltage and reducing the specific on-resistance.

BRIEF DESCRIPTION OF THE DRAWINGS

Figure 1:
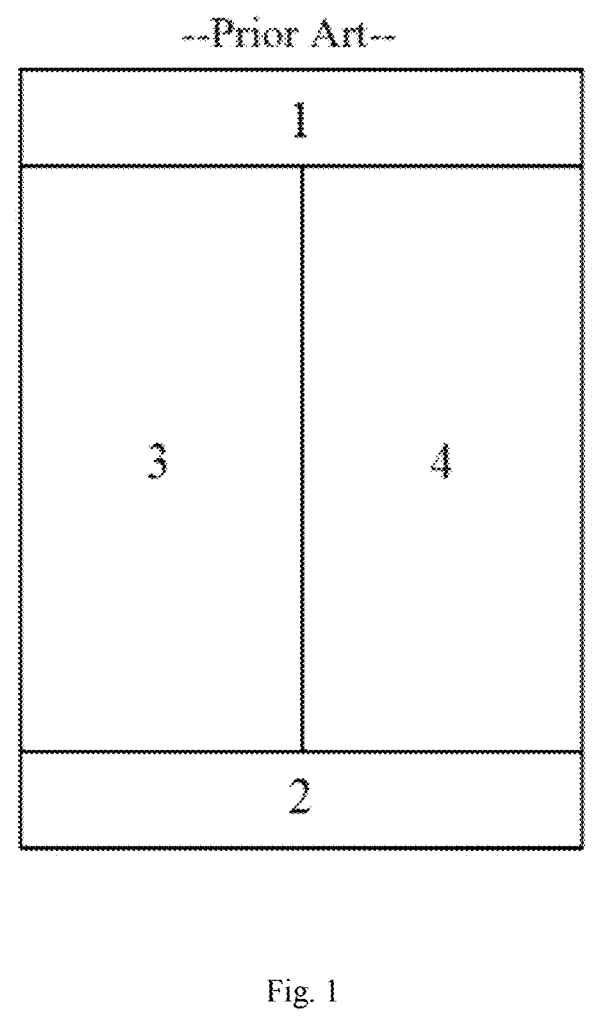

FIG. 1 is a schematic diagram of a conventional superjunction structure (C-SJ structure) in the prior art;

DETAILED DESCRIPTION OF EMBODIMENTS

This application will be described in detail below with reference to the accompanying drawings and the following embodiments.

Embodiment 1

Figure 3:
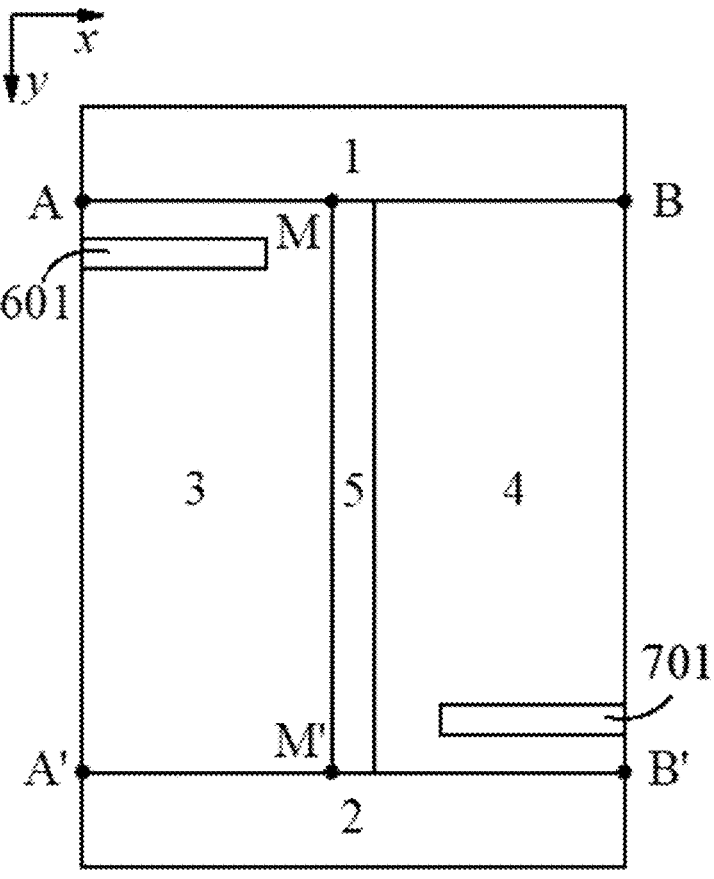
FIG. 3 is a schematic diagram of a voltage-sustaining layer according to Embodiment 1 of this application.

As shown in FIG. 3, a voltage-sustaining layer for semiconductors is provided, which includes an N-type heavily-doped drain region 2, an N-type doped region 3 located above the N-type heavily-doped drain region 2, a P-type doped region 4 located above the N-type heavily-doped drain region 2 and at a side of the N-type doped region 3, a P-type heavily doped source region 1 located above the N-type doped region 3 and the P-type doped region 4, an oxide insulator 5 provided between the N-type doped region 3 and the P-type doped region 4, a first oxide layer 601 located at a side in the N-type doped region 3 close to the P-type heavily doped source region 1 and a second oxide layer 701 located at a side in the P-type doped region 4 close to the N-type heavily doped region 2. The voltage-sustaining layer provided herein has a depth of 64 μm and an aspect ratio (AR) of 8. The N-type doped region 3 and the P-type doped region 4 each have a doping concentration of 3.26× $10^{15}$ cm$^{-3}$. A distance between the first oxide layer 601 and point A is 10 μm. The first oxide layer 601 has a width of 2 μm and a thickness of 0.4 μm. A distance between the second oxide layer 701 and point B' is 10 μm. The second oxide layer has a width of 2 μm and a thickness of 0.4 μm.

Figure 4:
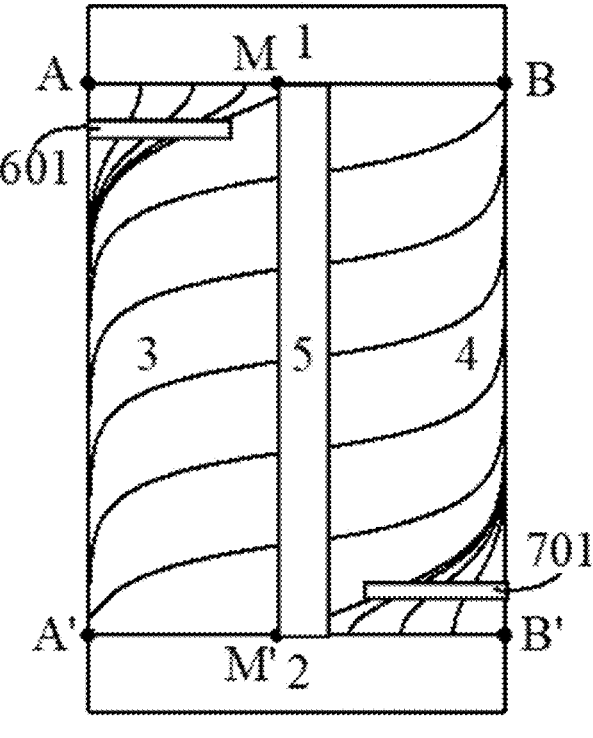
FIG. 4 schematically shows distribution of electric field lines of the voltage-sustaining layer according to Embodiment 1 of this application.

FIG. 4 schematically shows distribution of electric field lines of the voltage-sustaining layer provided in this embodiment. When the voltage-sustaining layer structure is turned off along a reverse direction, a reverse bias is applied, and the distribution of electric field lines is shown in FIG. 4. The first oxide layer 601 and the second oxide layer 701 are configured to effectively separate the path of the ionization integral, such that the maximum ionization integral of the device is reduced, thereby effectively improving the breakdown voltage of the device and strengthening a reverse voltage-sustaining performance. When the structure is turned on to the forward state, the doping concentration of each of the P-type doped region 4 and the N-type doped region 3 are increased to reduce the increased reverse voltage to a required value, and lower the specific on-resistance of the device, improving conduction current, strengthening the forward conduction capability.

Figure 2:
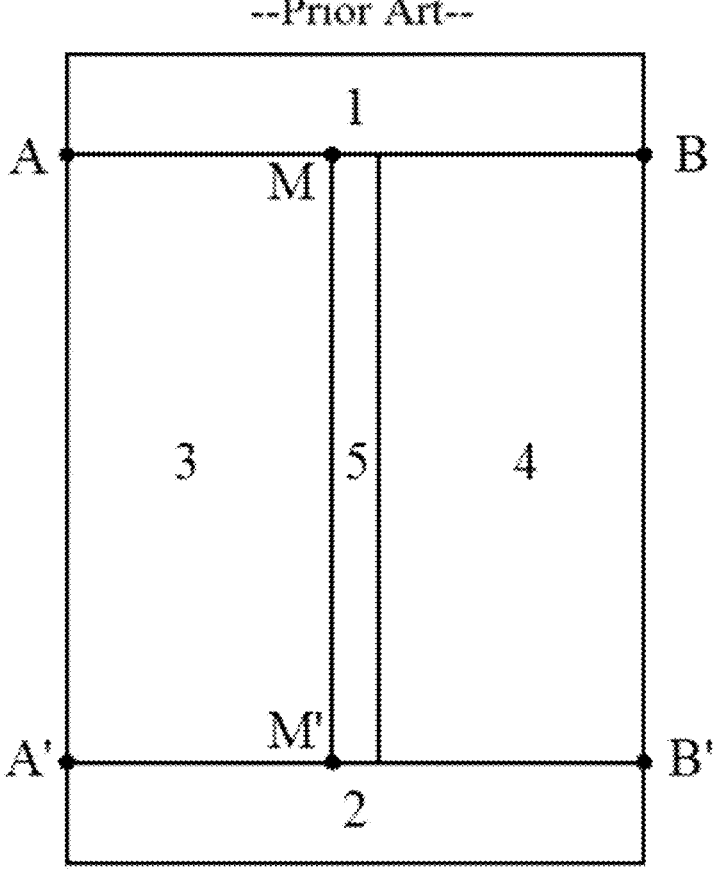
FIG. 2 is a schematic diagram of an insulator superjunction structure (I-SJ structure) in the prior art.
Figure 5:
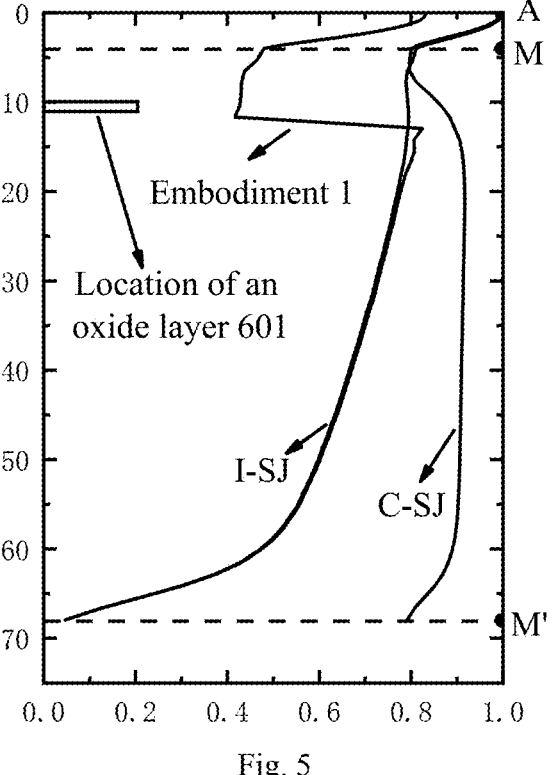
FIG. 5 schematically illustrates comparison among the voltage-sustaining layer in Embodiment 1, the I-SJ structure and the C-SJ structure in ionization integral.

FIG. 5 schematically illustrates comparison among the voltage-sustaining layer, the insulator superjunction structure (I-SJ structure) and the C-SJ structure in ionization integral shown in FIG. 2. It can be demonstrated by FIG. 5 that the voltage-sustaining layer provided herein is superior to the I-SJ structure. The ionization integral value of each point on the AM path is significantly reduced, and the maximum ionization integral value is reduced, thereby greatly increasing the breakdown voltage. In this embodiment, the breakdown voltage can return to the originally-required level by increasing the doping concentration of each of the P-type doped region 4 and the N-type doped region 3, and the specific on-resistance of the device is also reduced, greatly improving the performance of the device.

Embodiment 2

Figure 6:
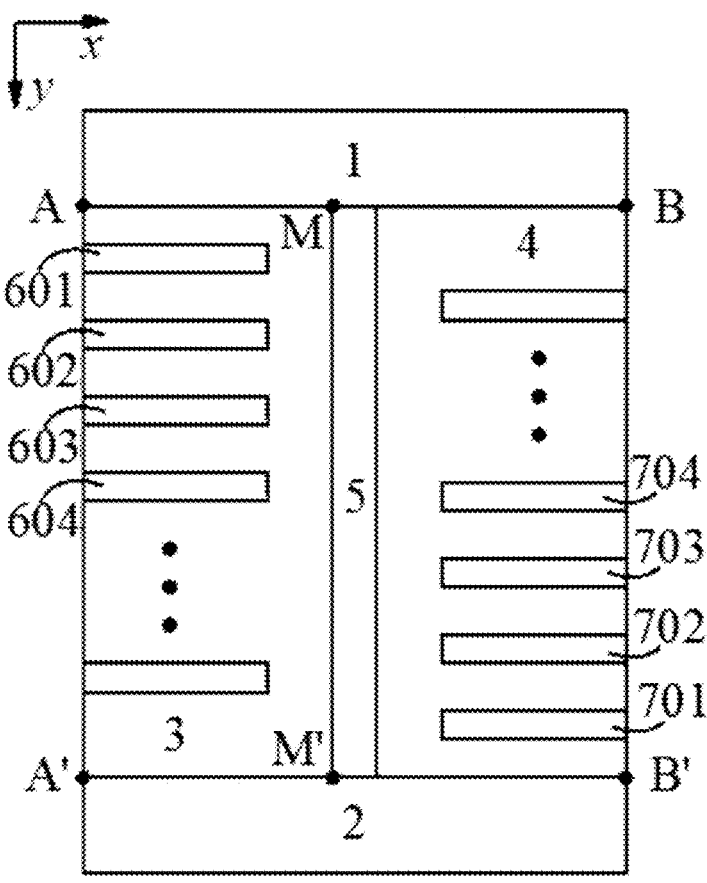
FIG. 6 is a schematic diagram of a voltage-sustaining layer according to Embodiment 2 of this application.

Embodiment 2 is basically the same as Embodiment 1, except that the first oxide layers of the same width and thickness are arranged evenly spaced apart at a side in the N-type doped region 3 close to the P-type heavily-doped source region 1; the second oxide layers with the same width and thickness are arranged evenly spaced apart at a side in the P-type doped region 4 close to the N-type heavily-doped drain region 2, as shown in FIG. 6. The path of ionization integral is further segmented by the first oxide layers and the second oxide layers, so as to reduce the maximum ionization integral, thereby increasing the breakdown voltage and reducing the specific on-resistance.

Embodiment 3

Figure 7:
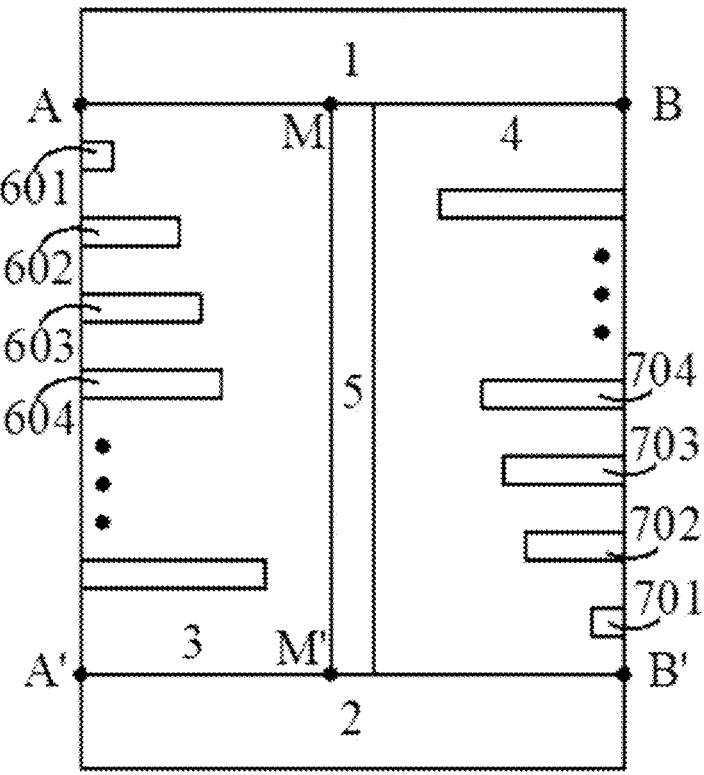
FIG. 7 is a schematic diagram of a voltage-sustaining layer according to Embodiment 3 of this application.

Embodiment 3 is basically the same as Embodiment 2, except that a width of each of the first oxide layers increases gradually along a direction from the P-type heavily-doped source region 1 to the N-type heavily-doped drain region 2; and a width of each of the second oxide layers gradually decreases along a direction from the P-type heavily-doped source region 1 to the N-type heavily-doped drain region 2, as shown in FIG. 7.

Embodiment 4

Figure 8:
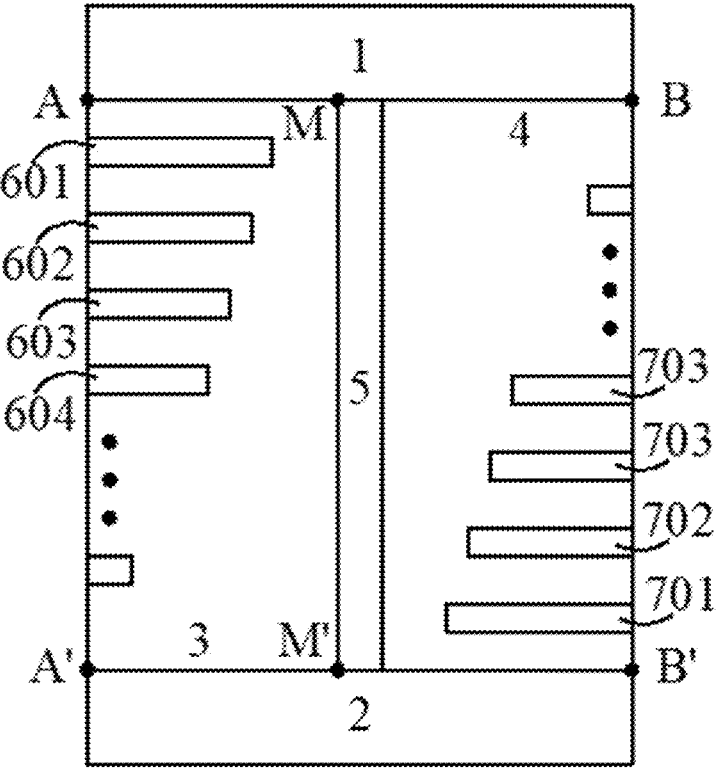
FIG. 8 is a schematic diagram of a voltage-sustaining layer according to Embodiment 4 of this application.

Embodiment 4 is basically the same as Embodiment 2, except that the width of each of the first oxide layers increases gradually along the direction from the P-type heavily-doped source region 1 to the N-type heavily-doped drain region 2; and the width of each of the second oxide layers gradually increases along the direction from the P-type heavily-doped source region 1 to the N-type heavily-doped drain region 2, as shown in FIG. 8.

Embodiment 5

Figure 9:
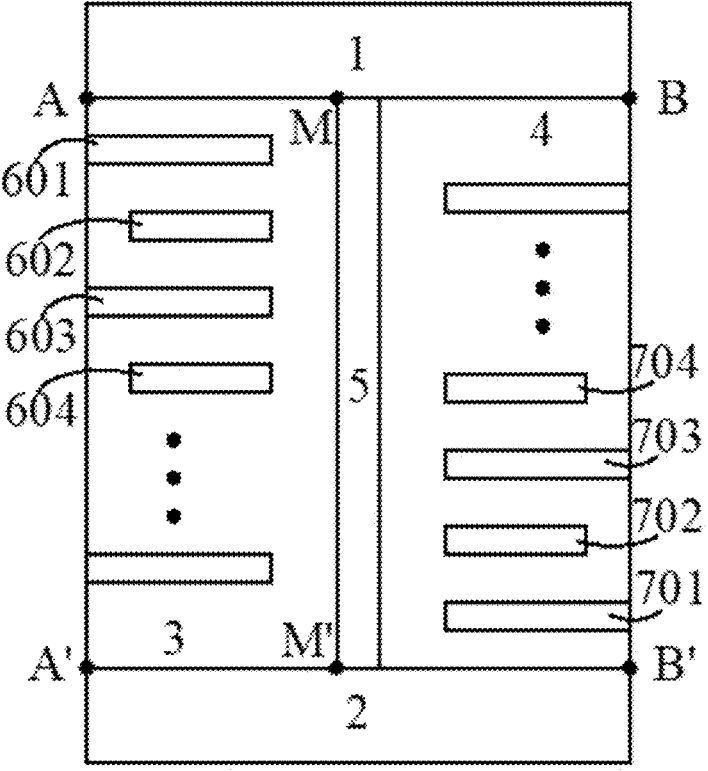
FIG. 9 is a schematic diagram of a voltage-sustaining layer according to Embodiment 5 of this application.
Figure 10:
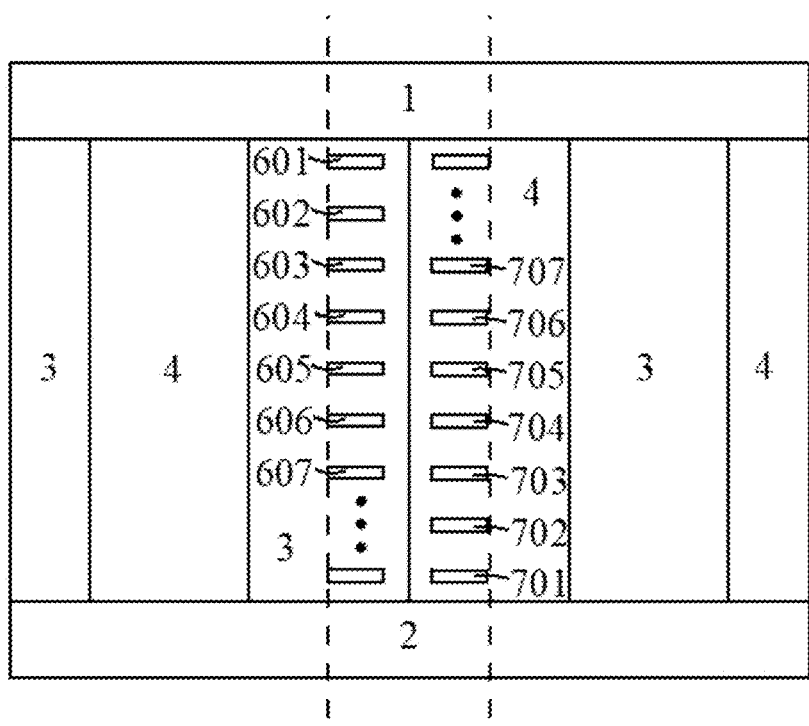
FIG. 10 is schematic diagram of a superjunction structure achieved by means of interdigitated layout.
Figure 11:
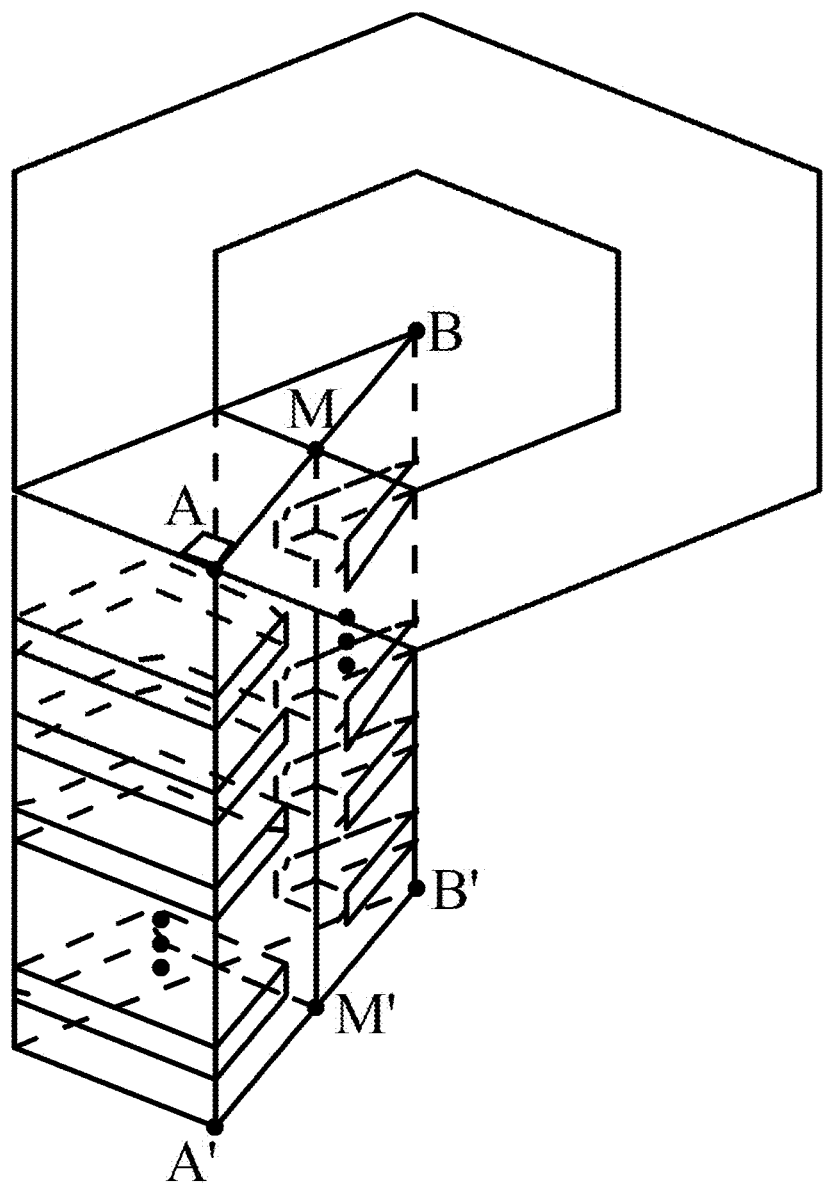
FIG. 11 is schematic diagram of a superjunction structure achieved by means of hexagonal layout.
Figure 12:
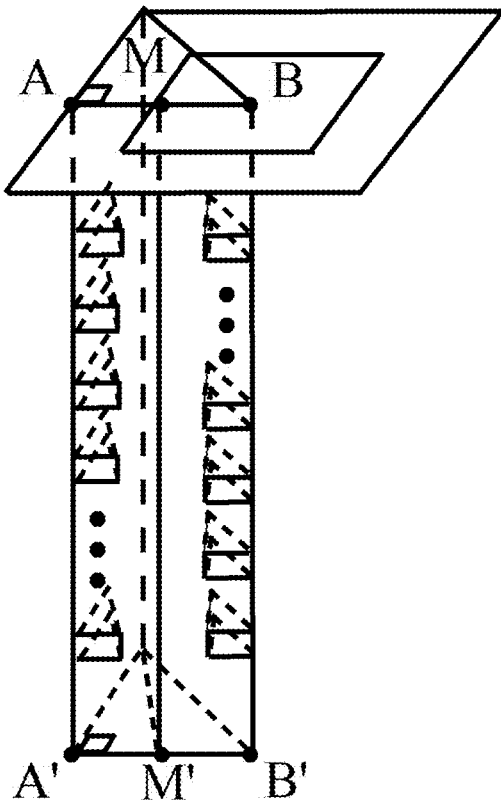
FIG. 12 is schematic diagram of a superjunction structure achieved by means of square layout.

Embodiment 5 is basically the same as Embodiment 2, except that each of the first oxide layers (602, 604, 606, . . . ) is separated from a left boundary of the N-type doped region 3, and each of the second oxide layers is separated from a right boundary of the P-type doped region 4, as shown in FIG. 9.

Embodiment 6

Figure 13:
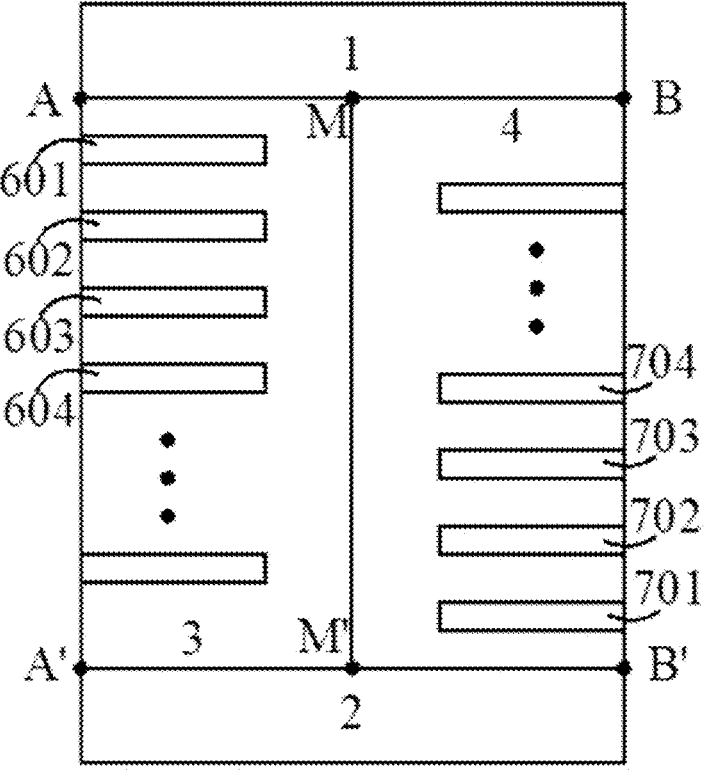
FIG. 13 is a schematic diagram of a voltage-sustaining layer according to Embodiment 6 of this application.

Embodiment 6 is basically the same as Embodiment 2, except that the oxide insulator 5 between the N-type doped region 3 and the P-type doped region 4 is absent, as shown in FIG. 13.

Embodiment 7

Figure 14:
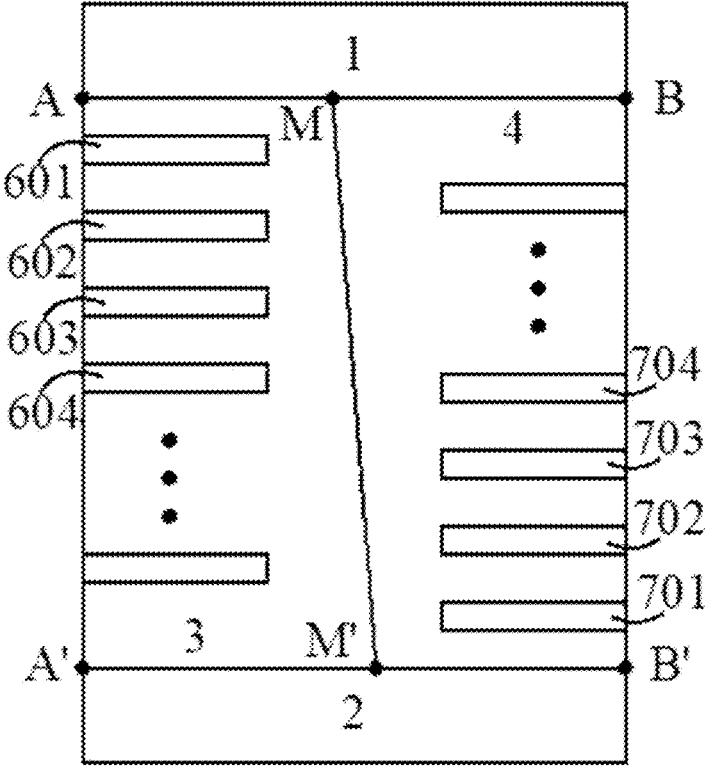
FIG. 14 is a schematic diagram of a voltage-sustaining layer according to Embodiment 7 of this application.

Embodiment 7 is basically the same as Embodiment 6, except that a tapered superjunction (T-SJ) with a trench angle is formed between the P-type heavily doped source region 1 and the N-type heavily-doped drain region 2, as shown in FIG. 14.

Embodiment 8

Figure 15:
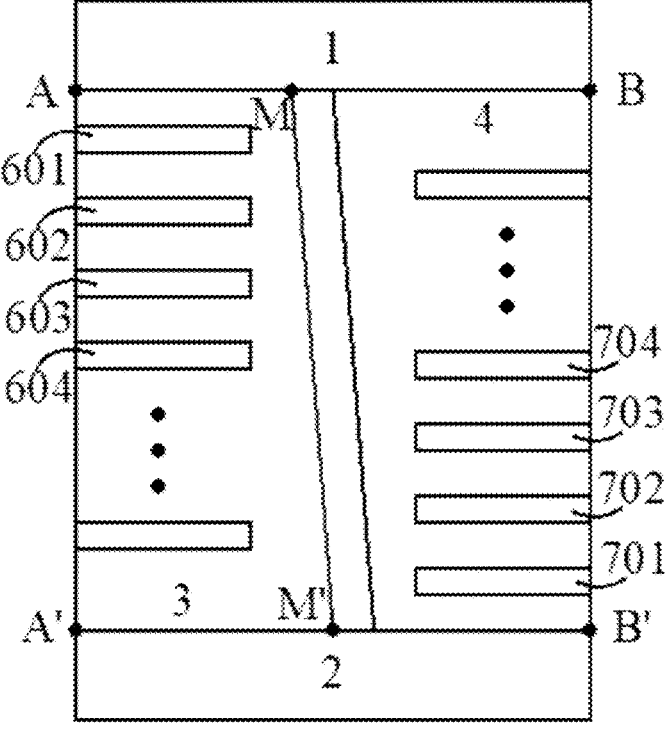
FIG. 15 is a schematic diagram of a voltage-sustaining layer according to Embodiment 8 of this application.

Embodiment 8 is basically the same as Embodiment 6, except that an oxide insulator with a trench angle is provided between the N-type doped region 3 and the P-type doped region 4, as shown in FIG. 15.

Embodiment 9

Figure 16:
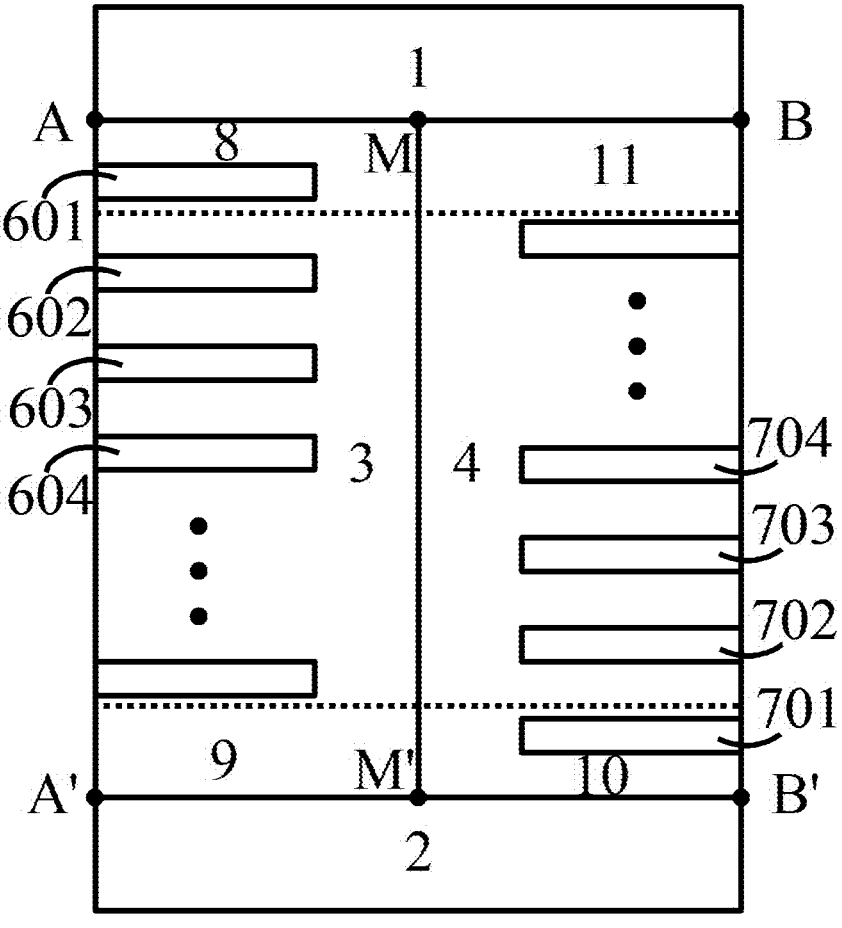
FIG. 16 is a schematic diagram of a voltage-sustaining layer according to Embodiment 9 of this application.

Embodiment 9 is basically the same as Embodiment 6, except that the N-type doped region 3, 8, and 9 and the P-type doped region 4, 10, and 11 each have a vertical varying doping profile, as shown in FIG. 16.

Embodiment 10

Figure 17:
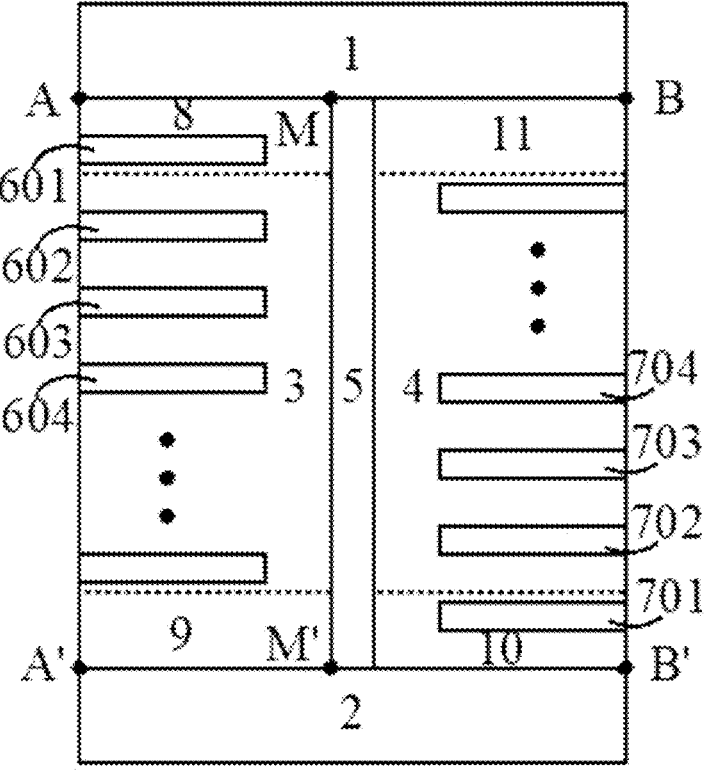
FIG. 17 is a schematic diagram of a voltage-sustaining layer according to Embodiment 10 of this application.

Embodiment 10 is basically the same as Embodiment 9, except that an oxide insulator 5 is provided between the N-type doped region 3 and the P-type doped region 4, as shown in FIG. 17.

Embodiment 11

Figure 18:
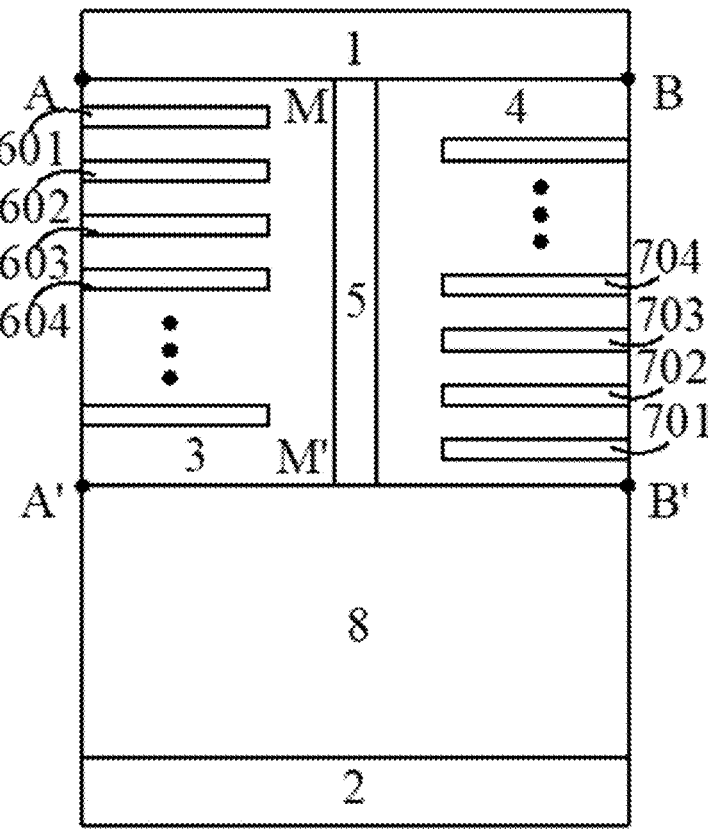
FIG. 18 is a schematic diagram of a voltage-sustaining layer according to Embodiment 11 of this application.

Embodiment 11 is basically the same as Embodiment 2, except that a N-type buffer layer 8 is provided between the N-type heavily-doped drain region 2 and both the N-type doped region 3 and P-type doped region 4, as shown in FIG. 18.

Embodiment 12

Figure 19:
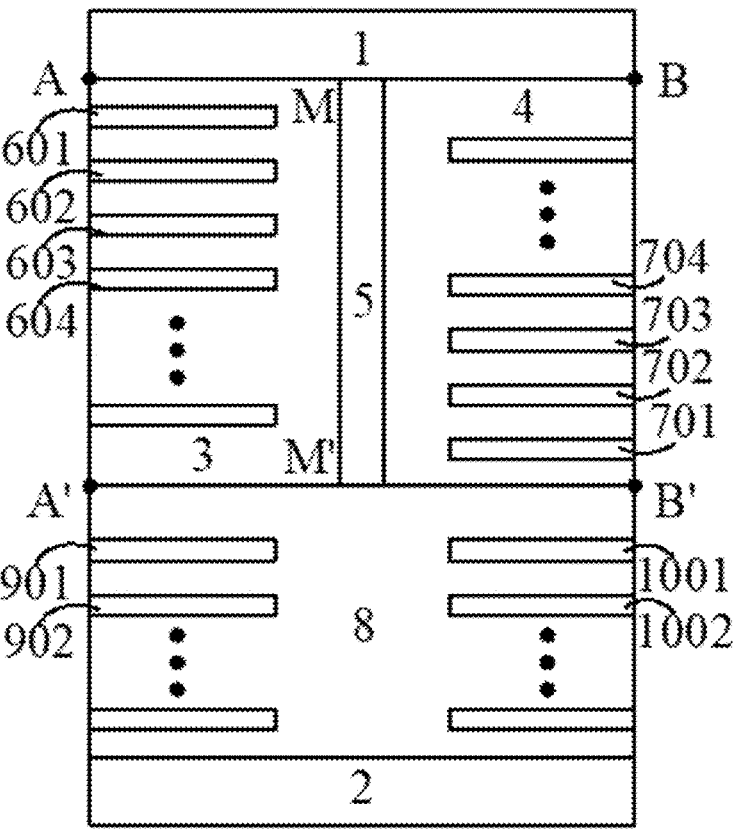
FIG. 19 is a schematic diagram of a voltage-sustaining layer according to Embodiment 12 of this application.

Embodiment 12 is basically the same as Embodiment 11, except that a plurality of third oxide layers (901, 902, . . . ) are provided at one side of the N-type buffer layer 8, and a plurality of fourth oxide layers are provided at the other side of the N-type buffer layer 8, as shown in FIG. 19.

Described above are merely preferred embodiments of this application, which are not intended to limit this application. It should be understood that any technical solutions made by those skilled in the art without departing from the spirit of this application shall still fall within the scope of this application defined by the appended claims.

What is claimed is:

1. A voltage-sustaining layer for semiconductors, comprising:
   a source region of a first conductive type;
   a drain region of a second conductive type, wherein the second conductive type is opposite to the first conductive type;
   a first region of the first conductive type;
   a second region of the second conductive type;
   N first oxide layers spaced apart from one another; and
   K second oxide layers spaced apart from one another;
   wherein the second region is located above the drain region; the first region is located above the drain region and at one side of the second region; the source region is located above the first region and the second region; the N first oxide layers are located in the second region and spaced apart from the first region, the source region, and the drain region; the K second oxide layers are located in the first region and spaced apart from the second region, the source region, and the drain region; and N and K are independently a positive integer greater than 1.

2. The voltage-sustaining layer of claim 1, wherein a tapered superjunction with a trench angle is formed between the second region and the first region.

3. The voltage-sustaining layer of claim 1, wherein an oxide insulator with a trench angle is provided between the second region and the first region.

4. The voltage-sustaining layer of claim 1, wherein the second region and the first region each have a vertical varying doping profile.

5. The voltage-sustaining layer of claim 3, wherein the second region and the first region each have a vertical varying doping profile.

6. The voltage-sustaining layer of claim 1, wherein a buffer layer is provided between the drain region and the second region and between the drain region and the first region, and the buffer layer is made of the second conductive type.

7. The voltage-sustaining layer of claim 3, wherein a buffer layer is provided between the drain region and the second region and between the drain region and the first region, and the buffer layer is made of the second conductive type.

8. The voltage-sustaining layer of claim 6, wherein a plurality of third oxide layers are provided at the first side of the buffer layer, horizontal to the interface between the buffer layer and the drain layer, and a plurality of fourth oxide layers are provided at the second side of the buffer layer, horizontal to the interface between the buffer layer and the drain layer.

9. The voltage-sustaining layer of claim 1, wherein each of the N first oxide layers is separated from a vertical boundary of the second region; and each of the K second oxide layers is separated from a vertical boundary of the first region.

10. The voltage-sustaining layer of claim 3, wherein each of the N first oxide layers is separated from a vertical boundary of the second region; and each of the K second oxide layers is separated from a vertical boundary of the first region.

11. The voltage-sustaining layer of claim 1, wherein the N first oxide layers and the K second oxide layers each have a thickness of 0.1~1 μm.

12. A superjunction structure, wherein the superjunction structure is achieved from the voltage-sustaining layer of claim 1 by interdigitated layout, hexagonal layout or square layout.

13. The voltage-sustaining layer of claim 1, wherein the N first oxide layers are closer to the source region than the drain region.

14. The voltage-sustaining layer of claim 1, wherein the K second oxide layers are closer to the drain region than the source region.

15. The voltage-sustaining layer of claim 13, wherein the K second oxide layers are closer to the drain region than the source region.

* * * * *